United States Patent
Glass

(10) Patent No.: US 12,313,709 B2
(45) Date of Patent: May 27, 2025

(54) MAGNETORESISTIVE SENSOR

(71) Applicant: Paragraf Limited, Somersham (GB)

(72) Inventor: Hugh Frederick John Glass, Somersham (GB)

(73) Assignee: Paragraf Limited, Somersham (GB)

( * ) Notice: Subject to any disclaimer, the term of this patent is extended or adjusted under 35 U.S.C. 154(b) by 250 days.

(21) Appl. No.: 17/970,971

(22) Filed: Oct. 21, 2022

(65) Prior Publication Data

US 2023/0128614 A1    Apr. 27, 2023

(30) Foreign Application Priority Data

Aug. 31, 2022  (GB) .................................. 2212651.0

(51) Int. Cl.
*G01R 33/09*    (2006.01)
*G01R 3/00*    (2006.01)

(52) U.S. Cl.
CPC ............. *G01R 33/093* (2013.01); *G01R 3/00* (2013.01)

(58) Field of Classification Search
CPC ...... G01R 33/093; G01R 3/00; G01R 33/007; G01R 33/0052
See application file for complete search history.

(56) References Cited

U.S. PATENT DOCUMENTS 5,878,486 A * 3/1999 Eldridge ............. H01L 21/4853 438/18
10,591,554 B2  3/2020 Kalon et al.
(Continued)

FOREIGN PATENT DOCUMENTS

| CN | 103985762 A | * 8/2014 | ....... H01L 29/66045 |
|---|---|---|---|
| CN | 105405965 A | 3/2016 | |

(Continued)

OTHER PUBLICATIONS

Asad, M., et al., "The Dependence of the High-Frequency Performance of Graphene Field-Effect Transisotrs on Channel Transport Properties," 2020, J Electronic Devices Society, 8:457-464, 8 pages.
Bonmann, M., et al., "Graphene Field-Effect Transisotrs with High Extrinsic fT and fmax," 2019, IEEE Electron Device Letters, 40/1:131-134, 4 pages.
He, H., et al., "Uniform Doping of Graphene Close to the Dirac Point by Polymer-Assisted Assembly of Molecular Dopants," 2018, Nature Communications, 9:3956, 7 pages.
Volkl et al., "Magnetotransport in Heterostructures of Transition Metal Dichalcogenides and Graphene," 2017, Physical Review B, 96: 125405-1-125404-5.

(Continued)

*Primary Examiner* — Feba Pothen
(74) *Attorney, Agent, or Firm* — Stinson LLP

(57) ABSTRACT

A magnetoresistive sensor is provided. The magnetoresistive sensor comprises a substrate having a layer structure thereon. The layer structure comprises a lower layer, and an upper layer. The lower layer is provided on the substrate, wherein the lower layer comprises one or more graphene layers which extend across the lower layer. The upper layer is provided on the lower layer and formed of a dielectric material. The lower and upper layers of the layer structure share one or more continuous edge surfaces. The magnetoresistive sensor further comprises a first electrical contact provided adjacent to the layer structure such that the first electrical contact is in direct contact with the one or more graphene layers via one of the one or more continuous edge surfaces, a second electrical contact provided adjacent to the layer structure such that the second electrical contact is in direct contact with the one or more graphene layers via one of the one or more continuous edge surfaces, and a continuous air-resistant coating layer covering the layer structure.

20 Claims, 4 Drawing Sheets

(56) References Cited

U.S. PATENT DOCUMENTS

2011/0102947 A1* 5/2011 Ogawa ............... G11B 5/3993
257/422
2015/0364567 A1 12/2015 Feng et al.

FOREIGN PATENT DOCUMENTS

| CN | 112038215 A | 12/2020 | | |
|---|---|---|---|---|
| GB | 2602119 A | 6/2022 | | |
| JP | 2015048258 A | 3/2015 | | |
| WO | WO-0209151 A2 * | 1/2002 | ............ | B82Y 10/00 |
| WO | 2021008938 A1 | 1/2012 | | |
| WO | 2015099614 A1 | 7/2015 | | |
| WO | 2017029470 A | 2/2017 | | |
| WO | 2019125267 A1 | 6/2019 | | |
| WO | 2019138230 A1 | 6/2019 | | |
| WO | 2022129606 A1 | 6/2022 | | |

OTHER PUBLICATIONS

Yager, T., et al., "Low Contact Resistance in Epitaxial Graphene Devices for Quantum Metrology," 2015, AIP Advances, 5:087134-1 through 087134-7, 7 pages.

Yager, T., et al., "Supplemental Material for: Low Contact Resistance in Epitaxial Graphene Devices for Quantum Metrology,".

Great Britain Search Report, Application No. GB2115100.6 dated Feb. 18, 2022, 4 pages.

Ukose, R., et al. "Room Temperature Co-doped Manganite/ Graphene Sensor Operating at High Pulsed Magnetic Fields", (2019), Scientific Reports, vol. 9, No. 9497, pp. 1-10.

Song, G., "Operation of Graphene Magnetic Field Sensors Near the Charge Neutrality Point," (2019), Communications Physics, vol. 2, No. 65, pp. 1-8.

Great Britain Search Report, Application No. GB2212651.0 dated Apr. 18, 2023, 4 pages.

* cited by examiner

MAGNETORESISTIVE SENSOR

REFERENCE TO RELATED APPLICATIONS

This application claims benefit of Great Britain Patent Application No. 2115100.6 filed Oct. 21, 2021 and Great Britain Patent Application No. 2212651.0 filed Aug. 31, 2022, the entire disclosures of which are incorporated herein by reference.

FIELD OF THE INVENTION

The present disclosure relates to a magnetoresistive sensor. In particular, the present disclosure relates to a magnetoresistive sensor comprising graphene.

BACKGROUND TO THE INVENTION

Magnetoresistance is the property of a material to change its electrical resistance in the presence of a magnetic field. A magnetoresistive sensor, or magnetoresistance sensor, utilises this property to determine a magnetic field acting on the magnetoresistive sensor based on the resistance of the magnetoresistive sensor.

Two dimensional (2D) materials, in particular graphene, are currently the focus of intense research and development worldwide. 2D materials have been shown to have extraordinary properties, both in theory and in practice which has led to a deluge of products incorporating such materials which include coatings, batteries and sensors to name but a few. Graphene is most prominent and is being investigated for a range of potential applications. Most notable is the use of graphene in electronic devices and their constituent components and includes transistors, LEDs, photovoltaic cells, Hall effect sensors, diodes and the like.

"Operation of graphene magnetic field sensors near the charge neutrality point" Song G., et al, Communications Physics, vol. 2, 21 Jun. 2019 discusses the magnetoresistance of graphene layers around the charge neutrality point.

"Room temperature Co-doped manganite/graphene sensor operating at high pulsed magnetic fields" Lukose R. et al., Scientific Reports, 1 Jul. 2019, discloses a magnetoresistive sensor comprising two different magnetoresistive materials—nanostructured Co-doped manganite La¬1-xSrx (Mn1-yCoy)zO3 and single- and few-layer graphene.

U.S. Pat. No. 10,591,554 B2 discloses a magnetic field sensor comprising a substrate layer and at least two graphene layers disposed on the substrate. The at least two graphene layers have electrodes fabricated thereon. The at least two graphene layers comprise a gate voltage tuned layer and an effective graphene layer and the effective graphene layer comprises one or more graphene layers. A magnetoresistance ratio of the graphene structure is determined by a difference in a charge mobility and/or a carrier density between the gate voltage tuned layer and the effective graphene layer. The charge mobility and/or the carrier density of the gate voltage tuned layer is tunable by a gate voltage applied to the graphene structure through the electrodes.

Against this background, it is an object of the invention to provide an improved, or at least commercially useful alternative, magnetoresistive sensor.

SUMMARY OF THE INVENTION

According to a first aspect of the disclosure, a magnetoresistive sensor is provided. The magnetoresistive sensor comprises:

a substrate having a layer structure thereon, the layer structure comprising:
a lower layer provided on the substrate, wherein the lower layer comprises one or more graphene layers which extend across the lower layer; and
an upper layer on the lower layer and formed of a dielectric material;
wherein the lower and upper layers of the layer structure share one or more continuous edge surfaces;
a first electrical contact provided adjacent to the layer structure such that the first electrical contact is in direct contact with the one or more graphene layers via one of the one or more continuous edge surfaces;
a second electrical contact provided adjacent to the layer structure such that the second electrical contact is in direct contact with the one or more graphene layers via one of the one or more continuous edge surfaces; and
a continuous air-resistant coating layer covering the layer structure.

The magnetoresistive sensor of the first aspect utilises one or more layers of graphene as a magnetoresistive material. Graphene is particularly well suited to magnetoresistive sensing applications as its magnetoresistance is relatively stable under repeated thermal cycles. By contrast, prior art magnetoresistive sensors can undergo a variation of up to 20% in accuracy under repeated thermal cycles.

Furthermore, a graphene-based magnetoresistive sensor, or magnetoresistance sensor, is particularly suited to applications where magnetoresistive sensing is to be performed at low temperatures, such as cryogenic temperatures. According to this disclosure, reference to a cryogenic temperature is understood to be any temperature no greater than 120 K. In particular, the present disclosure is concerned with the operation of magnetoresistive sensors at cryogenic temperatures no greater than: 20 K, 10 K, 5 K, 3 K, 2 K, or 1 K. As such, the graphene magnetoresistive sensor may be used at a range of temperatures.

It will be appreciated that the graphene magnetoresistive sensor may be formed from a graphene layer which may be a few nm thick. As such, compared to conventional magnetoresistive sensors formed from non-graphene materials (typically a ferrous alloy), the graphene magnetoresistive sensor of the first aspect may be provided in a relatively thin form factor. That is to say, the thickness of the graphene magnetoresistive sensor in a direction normal to the substrate, may be much thinner than convention magnetoresistive sensors.

It will also be appreciated that the lower layer comprising graphene is not a ferrous material. As such, the graphene magnetoresistive sensor may be provided without using any ferrous materials. Consequently, due to an absence of magnetic material within the device, the graphene magnetoresistive sensor may not produce cross-talk when in use. Thus, the graphene magnetoresistive sensor may be suitable for use in applications where highly accurate magnetic field sensing or control is desired.

The first and second electrical contacts are provided adjacent to the layer structure such that they only contact the outer edge surface of the graphene layer(s). Such a contact method provides markedly improved current injection into the graphene (relative to an Ohmic contact on the surface of the graphene). Further, forming contacts at the edge of the graphene layer(s) also minimises the contact area with the graphene sheet. This minimises any unwanted doping from what is typically a metal contact (such as one or more of titanium, aluminium, chromium and gold) which can otherwise limit the sensor sensitivity.

Whilst the upper layer provides substantial protection for the graphene layer(s) from atmospheric contaminates since it coats the entire graphene surface, the magnetoresistive sensor also comprises a continuous air-resistant coating layer extending across the coated graphene such that at least the remaining continuous outer edge surface is coated. This fully encapsulates the graphene and protects it from atmospheric contamination.

In some embodiments, the lower layer is formed from a single layer (monolayer) of graphene only. The single layer of graphene may be formed directly on the substrate, for example by a Chemical Vapour deposition process. By providing a magnetoresistive sensor comprising a monolayer of graphene which is formed directly on the substrate, the magnetoresistive sensor may be manufactured in an industrially scalable, and economic process.

In some embodiments, the lower layer is formed from a plurality of layers of graphene. In particular, the lower layer may be formed from 2 or 3 layers of graphene. In some embodiments, the lower layer may be formed from no more than 5 layers of graphene. It is thought that by forming the lower layer from a few layers of graphene means that the impact of any defects present are reduced, as the individual defects will form a lower proportion of the total active part of the device. Accordingly, forming the lower layer from a few layers of graphene may allow the magnetoresistive sensor to be manufactured in a reproducible manner and whist providing a suitably sensitive response to changes in magnetic field.

In some embodiments, when viewed in a plan view, one of the one or more continuous edge surfaces of the layer structure is a continuous outer edge surface of the layer structure. For example, in some embodiments, the upper layer of the layer structure may have the same shape (in plan view) as the lower layer of the layer structure. In other embodiments, the upper layer of the layer structure may have a different shape to the shape of the lower layer (in plan view).

In some embodiments, the second region of the substrate on which the first electrical contact is provided and the third region of the substrate on which the third electrical contact is provided are located at opposite ends of the first region of the substrate on which the layer structure is provided. As such, the first and second electrical contacts may be provided on opposing sides of the layer structure such an electrical voltage can be applied across the lower layer of the layer structure via the first and second electrical contacts.

In some embodiments, the layer structure is shaped such that one of the one or more continuous edge surface of the layer structure defines a rectangular shape on the substrate when viewed in plan view. That is to say, the lower layer comprising one or more graphene layers has a generally elongate shape along which a magnetoresistance may be measured.

In some embodiments, the layer structure is annular-shaped when viewed in plan view, such that the one or more continuous edge surfaces comprise a continuous outer edge surface and a continuous inner edge surface. By providing the lower layer with an annular shape, the magnetoresistive sensor may reduce or eliminate any adverse effect of the Hall effect on the measured magnetoresistance of the magnetoresistive sensor. In particular, the magnetoresistance of the lower layer may be measured in the radial direction, for example, by providing the first and second electrical contacts in direct contact with the continuous outer edge surface and the continuous inner edge surface respectively. Such an arrangement of the layer structure is similar to a "Corbino disc" arrangement.

In some embodiments, the first electrical contact is provided on the second region of the substrate adjacent to the layer structure such that the first electrical contact is in direct contact with the one or more graphene layers via the continuous outer edge surface. In some embodiments, the second electrical contact is provided on the third region of the substrate adjacent to the layer structure such that the third electrical contact is in direct contact with the one or more graphene layers via the continuous inner edge surface.

In some embodiments, the magnetoresistive sensor further comprises a third electrical contact in direct contact with the one or more graphene layers, and a fourth electrical contact in direct contact with the one or more graphene layers, the fourth electrical contact spaced apart from the third electrical contact. In some embodiments, the first and second electrical contacts are configured to receive a bias current, and the third and fourth electrical contact are configured to sense a magneto resistance of the one or more graphene layers. As such, the magnetoresistive sensor may be configured to perform a four terminal measurement of the magnetoresistance of the magnetoresistive sensor. Typically, a constant voltage may be applied between the first and second electrical contacts, while a (magneto) resistance is measured between the third and fourth electrical contacts. Such four-terminal measurement can be used to eliminate the effect of the contact resistance on the measurement of the resistance, thereby improving the accuracy of the magnetoresistive sensor.

In some embodiments, the third and fourth electrical contacts are each provided on the one or more graphene layers between the lower layer and the upper layer of the layer structure.

In some embodiments, the third electrical contact is provided on a third region of the substrate adjacent to the layer structure such that the third electrical contact is in direct contact with the one or more graphene layers via the continuous outer edge surface. In some embodiments, the fourth electrical contact is provided on a fourth region of the substrate adjacent to the layer structure such that the fourth electrical contact is in direct contact with the one or more graphene layers via the continuous outer edge surface. Providing the third and fourth electrical contacts in direct contact with the continuous outer edge surface may reduce unintentional doping of the lower layer, similar to the first and second electrical contacts.

In some embodiments, the substrate comprises sapphire, silicon, silicon dioxide, silicon nitride, silicon carbide, germanium, or a Group III-V semiconductor. In some embodiments, the substrate comprises a growth surface formed of a material selected from the group consisting of: YSZ, MgAl2O4, YAlO3, SrTiO3, and CaF2. The growth surface may be formed by a Chemical Vapour Deposition (CVD) method.

The growth substrate for use in the present method is provided with a growth surface wherein the growth surface is formed of a material selected from the group consisting of: yttrium stabilised zirconium oxide (YSZ), magnesium aluminate (MgAl2O4), yttrium aluminium perovskite (YAlO3 or YAP), strontium titanate (SrTiO3), and calcium difluoride (CaF2). In one embodiment, the growth substrate consists of one of said materials. Preferably, the thickness of the substrate is at least 250 μm, preferably at least 400 μm. However, preferably, the growth substrate further comprises a support layer which preferably comprises silicon or sapphire. As will be appreciated, a silicon support layer, for example, includes a "pure" silicon wafer (essentially consisting of silicon, doped or undoped) or what may be referred to as a CMOS wafer which includes additional associated circuitry. The thickness of the material used to form the growth surface of such a substrate may be much thinner. Preferably, the thickness is at least 5 nm, preferably at least 10 nm.

In some embodiments, the dielectric layer (upper layer) comprises an inorganic oxide, nitride, carbide, fluoride or sulphide, preferably alumina or silica. In some embodiments, the upper layer may be formed from a plurality of sub-layers. Each sub-layer may be formed from a dielectric material. For example, in some embodiments, the upper layer may comprise a first sub-layer and a second sub-layer. In some embodiments, the upper layer may also comprise a third sub-layer. Preferably, the first sub-layer of dielectric material (and/or the second sub-layer and/or the third sub-layer) is an inorganic oxide, nitride or sulfide, for example one or more of the metal oxides $Al_2O_3$, ZnO, $TiO_2$, $ZrO_2$, $HfO_2$, $MgAl_2O_4$, and YSZ, preferably alumina ($Al_2O_3$) or hafnia ($HfO_2$), these materials being particularly suited for ALD. ALD is technique known in the art and comprises the reaction of at least two precursors in a sequential, self-limiting manner. Repeated cycles to the separate precursors allow the growth of a thin film in a conformal manner (i.e. uniform thickness across the entire substrate, the surface of the graphene layer structure in the present method) due to the layer-by-layer growth mechanism. Alumina is a particularly preferred coating material and can be formed by sequential exposure to trimethylaluminium (TMA) and an oxygen source, preferably one or more of water ($H_2O$), $O_2$, and ozone ($O_3$). ALD is particularly advantageous because a coating may be formed reliably over the entire substrate (i.e. provides a conformal coating).

The inventors were particularly surprised to find that by depositing the first sub-layer of dielectric material by ALD (or indeed the entire dielectric layer in a single ALD process), as opposed to other methods such as the deposition of a metal layer and auto-oxidation to form a metal oxide dielectric layer, a magnetoresistive sensor with improved properties can be obtained. In particular, the sensitivity of the resulting device is improved. Further when a first sub-layer is deposited in combination with a second sub-layer of dielectric material, the highly sensitive graphene layer structure is also prevented from contamination thereby avoiding loss in the desirable electronic properties.

Preferably, the ALD uses ozone as an oxygen precursor. Preferably, the ozone is provided as a mixture with oxygen, preferably in a concentration of 5 to 30 wt. % (i.e. of the oxygen precursor), more preferably 10 to 20 wt. %. The inventors were also surprised to find that, contrary to common ALD methods, it is beneficial when forming the first dielectric layer by ALD directly on the graphene for the ALD to be performed at a temperature of less than 120° C., more preferably less than 100° C. Those skilled in the art invariably perform ALD at higher temperatures than those which the inventors found to be advantageous. The inventors have found that the use of ozone and/or the low temperature, especially both, provide an advantageous method for improving the electronic properties of the graphene in the final product. Even more specifically, the combination is advantageous for graphene formed directly on the substrate by CVD as described herein. Such graphene which has not been subject to a transfer process, such as from a catalytic metal substrate, does not suffer the same imperfections and defects resulting from the physical manipulation. These defects act as nucleation sites for growth of the dielectric material by ALD whereas, when formed directly on the substrate, there are substantially fewer, if any, defects. The inventors found the conditions described are those which are most preferred for ALD in the absence of the defects and impurities for nucleation.

Suitable precursors which provide the required inorganic element, such as the preferred aluminium or hafnium atoms for alumina and hafnia, are well-known, commercially available and not particularly limited. Metal halides such as metal chlorides (e.g. $AlCl_3$ and $HfCl_4$) may be used. Alternatively, metal amides, metal alkoxides or organometallic precursors may be used. Hafnium precursors include, for example, tetrakis(dimethylamido)hafnium(IV), tetrakis(diethylamido)hafnium(IV), hafnium(IV) tert-butoxide and dimethylbis(cyclopentadienyl)hafnium(IV). Preferably, the barrier layer is alumina and preferably a further precursor for the ALD is a trialkyl aluminium or trialkoxide aluminium, such as trimethylaluminium, tris(dimethylamido)aluminium, aluminium tris(2,2,6,6-tetramethyl-3,5-heptanedionate) or aluminium tris(acetylacetonate).

Without wishing to be bound by theory, it is believed that by depositing the first sub-layer of the upper layer by ALD, particularly under the conditions described, the electronic properties of the device are improved at least by virtue of the preferable charge carrier density of the graphene layer structure. In some embodiments, the one or more graphene layers of the lower layer may have a charge carrier density of less than $1 \times 10^{12}$ $cm^{-2}$, or less than $5 \times 10^{11}$ $cm^{-2}$. As will be appreciated, such values are measured under ambient conditions (e.g. room temperature at about 20° C.). The inventors have found that the ALD precursors and temperatures can be selected so as to counteract the doping of the lower layer.

As will be appreciated, the upper layer may be formed of two or more sub-layers of dielectric material. For example, in some particularly preferred embodiments, the upper layer is formed of two sub-layers of dielectric material, each formed by ALD. In some preferred embodiments, the upper layer comprises two sub-layers of dielectric material, each formed of the same material, such as alumina. Each sub-layer may be formed under different deposition conditions. Preferably, the first sub-layer, which is deposited before the second sub-layer, is formed by ALD at a lower temperature than the second sub-layer. Preferably, it is the first sub-layer that is deposited at temperatures as described hereinabove for the first sub-layer and/or is deposited using ozone.

The second sub-layer may be deposited at a temperature of 100° C. or more, preferably 120° C. or more. Preferably, the second sub-layer is formed using $H_2O$ as an oxygen precursor. Deposition by ALD at higher temperatures and/or using water as a precursor typically results in a dielectric layer having higher density. Accordingly, even where the same material is used, sub-layers may be readily detected in resulting products using conventional techniques in the art such as cross-section scanning tunnelling microscopy.

In some embodiments, formation of the upper layer may in some embodiments also comprise a first step of depositing a layer of dielectric transition metal oxide as a seed sub-layer, the transition metal oxide having a high work function, for example 6 eV or more, more preferably 6.5 eV or more. A seed sub-layer is typically incomplete or contains pores, permitting the ALD-grown layer to be formed directly on the graphene around the seed sub-layer portions. Work functions of known and available metal oxides are typically no greater than 8 eV, or even 7.5 eV. For example, suitable transition metal oxides may be selected from the group consisting of: molybdenum oxide (e.g. $MoO_3$, $MoO_2$), chromium oxide (e.g. $CrO_3$, $Cr_2O_3$), vanadium oxide ($V_2O_5$), tungsten oxide ($WO_3$), nickel oxide (NiO), cobalt oxide ($Co_3O_4$), copper oxide (CuO), silver oxide (AgO), titanium oxide ($TiO_2$), tantalum oxide ($Ta_2O_5$), and mixtures thereof, preferably molybdenum oxide (e.g. $MoO_3$), chromium oxide (e.g. $CrO_3$), vanadium oxide, tungsten oxide, nickel oxide, and mixtures thereof. $MoO_3$ is most preferred. The addition of such transition metal oxide has been found to afford significantly improved temperature stability to the final device to allow the device to be used in high temperature applications in combination with the layer(s) described above deposited by ALD thereon.

The transition metal oxide seed sub-layer may have a thickness of from 0.1 nm to 5 nm, preferably up to 2 nm. The desired nominal thickness can be achieved through use of a Quartz Crystal Microbalance (QCM) during formation which provides the skilled person with an in-situ measurement of the amount of material deposited when carrying out the method. The thickness of the layer is therefore a mean average thickness of the layer.

ALD, particularly when using ozone, can serve to functionalise exposed portions of the graphene layer structure having the seed layer thereon (which typically arises where the thickness is 2 nm or less). Ozone also serves to p-dope the graphene layer structure, though the inventors have found that in the absence of the transition metal oxide, the ozone p-doping is less stable on heating. For example, an alumina layer deposited by ALD onto bare graphene using ozone as a precursor can provide excellent sensitivity in the final magnetoresistive sensor, though fails to also enhance thermal stability.

As such, in some embodiments the dielectric layer may comprise a seed sub-layer formed directly on the lower layer. A first sub-layer may then be formed on the seed sub-layer, followed by the formation of a second sub-layer on the first sub-layer. As such, the upper layer may comprise a seed sub-layer formed directly on the lower layer, a first sub-layer formed on the seed sub-layer, and a second sub-layer formed directly on the first sub-layer.

In some embodiments, the air-resistance coating layer comprises an inorganic oxide, nitride, carbide, fluoride or sulphide, preferably alumina or silica.

In some embodiments, the upper layer and the lower layer may be provided on the substrate such that the layer structure has at least one axis of symmetry, preferably two axes of symmetry. In some embodiments, the first and second electrical contacts may also provided in a similarly symmetrical manner. As such, it will be appreciated that in some embodiments, the graphene magnetoresistive sensor may be provided as a generally symmetrical device. In particular, it will be appreciated that the graphene magnetoresistive sensor is not a polar device, meaning that the device can be connected in an electrical circuit in either direction.

According to a second aspect of the disclosure, a magnetoresistive measurement system is provided. The magnetoresistive measurement system comprises a magnetoresistive sensor according to the first aspect of the disclosure, and a resistance measurement system connected to the magnetoresistive sensor, the resistance measurement system configured to measure a resistance of the one or more graphene layers.

For example, in the case of a two-terminal device comprising first and second electrical contacts, the resistance measurement system may be connected to the first and second electrical contacts in order to measure a resistance of the magnetoresistive sensor. In the case of a four-terminal device, the resistance measurement system may be configured to apply a constant voltage between a pair of electrical contacts, while a resistance is measured between another pair of electrical contacts. Where the four electrical contacts are arranged along a length of the layer structure, the resistance may be measured between an inner pair of electrical contacts, while an outer pair of electrical contacts may be used to apply the constant voltage.

In some embodiments, the magnetoresistive measurement system may be configured to perform a temperature measurement using the magnetoresistive sensor. The resistance of graphene at zero applied magnetic field has a varying and repeatable dependence on temperature. Accordingly, the resistance measurement system may be configured to measure a resistance of the magnetoresistive sensor under no applied magnetic field. Based on this resistance measurement, a temperature of the magnetoresistive sensor may be determined. The temperature may be determined based on a known resistance-temperature relationship for the graphene of the lower layer. As the temperature-resistance relationship of graphene does not vary over time, it is possible to accurately determine the temperature of the lower layer 22 based on a resistivity measurement of the graphene. The magnetoresistive sensor 1 may use the temperature information to improve the accuracy of the magnetic field determined by the magnetoresistance measurement.

By using a graphene-based temperature sensor, the thermal mass of the temperature sensing part of the magnetoresistive sensor effectively has the same thermal mass as the thermal mass of the graphene magnetoresistive sensor used to determine the magnetic field. By using graphene devices for both measurements, any variations in temperature of the graphene magnetoresistive sensor will be reflected by variations in the resistance of the graphene. That is to say, unlike temperature sensors formed from a different material to a magnetoresistive sensor, there will be no thermal lag due to differences in thermal mass between the temperature of the graphene magnetoresistive sensor and the measured temperature.

According to a third aspect of the disclosure, a method of sensing a magnetic field is provided. The method comprises:
  exposing a magnetoresistive sensor according to the first aspect to a magnetic field;
  measuring the resistance of the magnetoresistive sensor; and
  calculating a strength of the magnetic field based on the measured resistance of the magnetoresistive sensor.

The method of the third aspect of the disclosure may be performed using the magnetoresistive measurement system of the second aspect of the disclosure.

According to a fourth aspect of the disclosure, a method of producing a magnetoresistive sensor is provided. The method comprises:
  (i) providing a plasma-etchable layer structure on a substrate, wherein the plasma-etchable layer structure has an exposed upper surface, the plasma-etchable layer structure comprising one or more graphene layers extending across the plasma layer structure;
  (ii) patterning a plasma-resistant dielectric onto a portion of the exposed upper surface to form an intermediate having at least one covered region and at least one uncovered region of the plasma-etchable layer structure;
  (iii) subjecting the intermediate to plasma etching, whereby the at least one uncovered region of the plasma-etchable layer structure is etched away to form at least one etched layer structure layer structure having one or more exposed edge surfaces;

(iv) forming a first electrical contact adjacent to the etched layer structure such that the first electrical contact is in direct contact with the one or more graphene layers via one of the one or more edge surfaces and a second electrical contact adjacent to the etched layer structure such that the second electrical contact is in direct contact with the one or more graphene layers via one of the one or more edge surfaces;

(v) forming a continuous air-resistant coating layer over the etched layer structure.

As such, the method of the fourth aspect may produce a magnetoresistive sensor according to the first aspect of the disclosure. In particular, it will be appreciated that discussion regarding the formation of the upper layer of the first aspect is particularly applicable to the step of patterning a plasma-resistant dielectric on to a portion of the exposed upper surface to form an intermediate. That is to say, it will be appreciated that the plasma-resistant dielectric of the second aspect may be formed from a plurality of sub-layers as described above.

Specifically, in some embodiments, the plasma-resistant dielectric may be formed on the plasma-etchable layer structure having a plurality of sub-layers. For example, the plasma-resistant dielectric may be formed by forming a first sub-layer on the plasma-etchable layer structure followed by a forming a second sub-layer on the first sub-layer. In some embodiments, the first sub-layer may be formed directly on the plasma-etchable layer structure, or in some embodiments a seed sublayer may be formed directly on the plasma-etchable layer structure, followed by forming the first sub-layer on the seed sub-layer. As discussed above, it is preferably that the layers of the plasma resistant dielectric are formed by an ALD process.

BRIEF DESCRIPTION OF THE DRAWINGS

The invention will now be described in relation to the following non-limiting figures. Further advantages of the disclosure are apparent by reference to the detailed description when considered in conjunction with the figures in which.

DETAILED DESCRIPTION OF THE INVENTION

Figure 1:
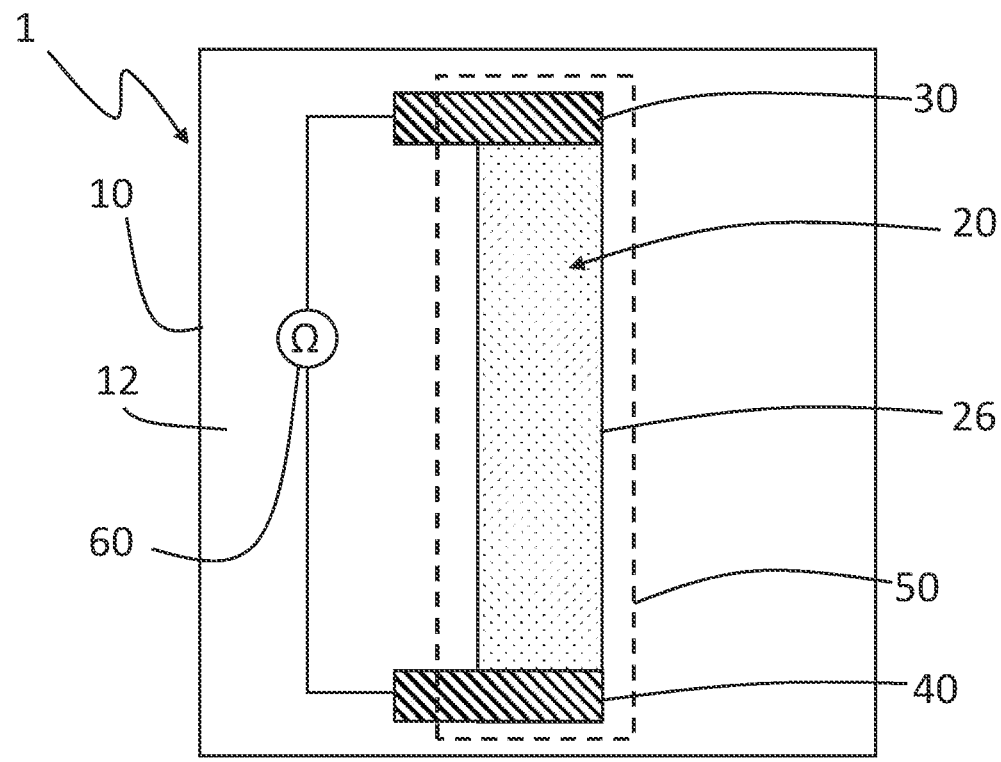
FIG. 1 shows a plan view schematic diagram of a magnetoresistive sensor according to a first embodiment of the disclosure.
Figure 2:
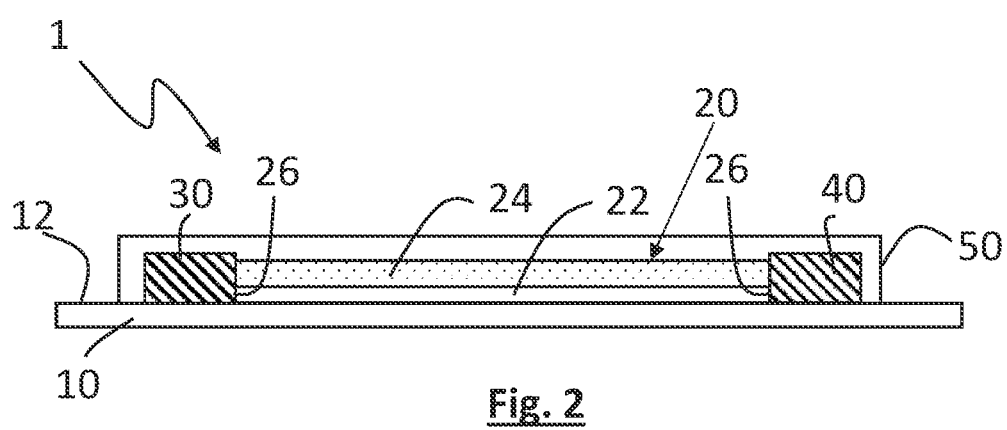
FIG. 2 shows a side view schematic diagram of a magnetoresistive sensor according to a first embodiment of the disclosure.

According to a first embodiment of the disclosure a magnetoresistive sensor 1 is provided. The magnetoresistive sensor 1 comprises a substrate 10, a layer structure 20, a first electrical contact 30 a second electrical contact 40 and a continuous air-resistance coating layer 50. FIG. 1 shows a plan view of the magnetoresistive sensor 1 of the first embodiment. FIG. 2 shows a side view of the magnetoresistive sensor 1 of the first embodiment.

As shown in FIGS. 1 and 2, a substrate 10 is provided. The substrate 10 may comprise any suitable substrate on which one or more layers of graphene may be formed. For example, the substrate 10 may comprise a multi-layer substrate, wherein one layer of the substrate 10 provides the major surface 12 on which the graphene is formed. For example, the substrate 10 may comprise a silicon wafer with a layer of Al2O3 formed on a surface of the silicon wafer, wherein the exposed surface of the Al2O3 layer provides the major surface 12 on which the lower layer 22 is provided. Alternatively, the substrate 10 may comprise a sapphire substrate, or a silicon substrate.

As shown in FIGS. 1 and 2, a layer structure 20 is formed on the substrate 10. As shown in FIG. 2, the layer structure 20 comprises a lower layer 22 and an upper layer 24. In the embodiment of FIGS. 1 and 2, the lower layer 22 comprises one or more layers of graphene. As shown in FIG. 1, the upper layer 24 may have an identical shape to the lower layer 22. As such, the layer structure has a continuous edge surface 26 about the perimeter of the layer structure when viewed in the plan view of FIG. 1. The continuous edge surface 26 is provided by the respective edge surfaces of the lower layer 22 and the upper layer 24.

In the embodiment of FIGS. 1 and 2, the lower layer 22 comprises one or more layers of graphene (not shown). The graphene layer(s) of the lower layer may have the same (plan view) shape as the upper layer 24 of the layer structure. The graphene layer(s) are formed on the major surface 12 of the substrate 10. The graphene layer(s) are a substantially continuous layer of graphene. The graphene layer(s) may be formed on the substrate 10 according to the process described in at least WO-A-2017/029470, the entire contents of which is hereby incorporated by reference.

Further, the graphene layer(s) may be manufactured in accordance with the disclosure of UK Patent Application No. 2020131.5, the entire contents of which is hereby incorporated by reference. The graphene layer(s) may be a graphene sheet (a monolayer), or a graphene layer structure formed of 1 to 10 graphene sheets.

According to embodiments of the disclosure, it is preferable that the lower layer 22 is comprises a monolayer of graphene. That is to say, only a single layer of graphene is present in the lower layer 22, rather than a plurality of graphene layers. By forming the lower layer 22 from a monolayer of graphene, the magnetoresistive effect of the magnetoresistive sensor may be improved.

In the embodiment of FIGS. 1 and 2, the graphene layer(s) are formed on the entire major surface 12 of the substrate 10, followed by formation of the upper layer 24 in the desired pattern for the layer structure 20. The graphene layer(s) not covered by the upper layer 24 may then be removed by plasma etching. A suitable plasma etching process may involve etching for 30 s with 6 sccm of $O_2$ flow rate at 40% power on a 100 W plasma etching apparatus.

In an alternative method for forming the embodiment of FIGS. 1 and 2, the graphene layer(s) are formed on the entire major surface 12 of the substrate 10, followed by formation of the upper layer 24 on the entire major surface of the lower layer. The upper layer 24 may then be patterned, for example using a lithographic process to define a desired pattern. Unpatterned regions of the upper layer 24 and the graphene layer(s) below may then selectively removed, for example using etching, to provide the desired pattern for the layer structure 20.

The upper layer 24 comprises a dielectric material. The upper layer 24 may be, for example, silica, hafnia or alumina, preferably alumina, formed either by evaporation or atomic layer deposition (ALD). The upper layer 24 may have a thickness (in a plane normal to the major surface 12 of the substrate 10) of about 10 nm. In the embodiment of FIGS. 1 and 2, the layer structure 20 is formed in a substantially rectangular shape when viewed in plan view. Of course, in other embodiments it will be appreciated that other shapes for the layer structure 20 may be provided. Further examples of possible shapes are discussed below in relation to the other embodiments, but it will be appreciated that the shape of the layer structure 20 is not limited to the embodiments discussed in this disclosure.

In some embodiments, the upper layer 24 may be formed from a plurality of sub-layers. For example, the upper layer 24 may be formed from a first sub-layer and a second sub-layer. In some embodiments, a first sub-layer may be formed on the lower layer 22 followed by forming the second sub-layer on the first sub-layer. In some embodiments, a first sub-layer acts as a seed layer on which a dielectric layer (second sub-layer) may subsequently be formed. For example, a first sub-layer of molybdenum oxide having a nominal thickness of less than 5 nm may be formed on the lower layer 22. A second sub-layer of alumina may then be formed on the first sub-layer. The second sub-layer of alumina may be formed using an ALD process. For example, the second sub-layer may be formed by an ALD process using a mixture of oxygen and 15 wt. % ozone as an oxygen precursor, conducted at a temperature of about 80° C. The cycles of oxygen precursor and aluminium precursor are repeated to provide a thickness of at least 5 nm resulting in a charge carrier density of less than $5 \times 10^{11}$ cm$^{-2}$.

In some embodiments, the upper layer 24 may be formed from a plurality of sub-layers comprising first, second, and third sub-layers. The first and second sub-layers may be formed as described above. A third sub-layer may then be formed on the second sub-layer. The third dielectric layer may be an additional dielectric sub-layer. For example, a third sub-layer may be formed by an ALD process. In some embodiments the third sub-layer may be formed by depositing alumina by ALD on the second sub-layer. The third sub-layer may be formed using ALD with H$_2$O (rather than ozone) at a temperature of about 150° C. In some embodiments, the third sub-layer may have a thickness such that the thickness of the upper layer is no greater than about 100 nm. For example, the third sub-layer may have a thickness of about 50 nm, 60 nm, 65 nm, 70 nm, 80 nm, or 90 nm.

In the embodiment of FIGS. 1 and 2, a first electrical contact 30 and a second electrical contact 40 are each formed in direct electrical contact with lower layer 22 of the layer structure 20. The first electrical contact is provided on a second region of the substrate 10. The second electrical contact is provided on a third region of the substrate 10. The second and third regions of the substrate are spaced apart from each other. Each of the first and second electrical contacts 30, 40 are formed on a respective region of the substrate 10 adjacent to the layer structure 20 (i.e. adjacent to the first region of the substrate 10) such that they are in direct contact with the one or more graphene layers via the continuous edge surface 26 of the layer structure 20.

In the embodiment of FIGS. 1 and 2, the first electrical contact 30 is formed in direct electrical contact with a first end of the generally rectangular layer structure 20. The second electrical contact 40 is formed in direct electrical contact with a second end of the generally rectangular layer structure 20. The second end of the layer structure 20 is an end of the layer structure opposite to the first end. As shown in FIG. 1, the first and second electrical contacts 30, 40 are each formed in a bar-shape (when viewed in plan view from above the substrate). The first and second electrical contacts 30, 40 are positioned with respect to the first and second ends of the layer structure 20 so that they make contact to the edge of the graphene at the first and second ends of the layer structure. The first and second electrodes 30, 40 each extend away from the ends of the layer structure 20 such that further electrical connections can be made to magnetoresistive sensor 1.

In the embodiment of FIG. 2, the first and second electrical contacts 30, 40 may be formed by thermal evaporation of the one or more contact materials. The shape of the contacts may be defined performing the thermal evaporation process through a suitable shadow mask, or alternatively using a lithographic process. The first and second electrical contacts 30, 40 may each comprise any material suitable for making an Ohmic contact to the graphene layer(s) of the lower layer 22. For example, the first and second electrical contacts 30, 40 may comprise one or more of titanium, aluminium, chromium and gold.

As shown in FIG. 1 by the dashed line, the magnetoresistive sensor 1 includes a continuous air-resistant coating layer 50. The continuous air-resistant coating layer 50 is provide to encapsulate the graphene layer(s) of the magnetoresistive sensor 1. In FIG. 1 the continuous air-resistant coating layer is illustrated as semi-transparent so as to illustrate the presence of the underlying layer structure 20.

As shown in FIG. 2, the continuous air-resistant coating layer 50 is provided over the graphene layer(s) and the upper layer 24, and a portion of each of the first and second electrical contacts 30, 40. It will be appreciated from FIG. 1 that the continuous air-resistance coating layer 50 partially covers the first and second electrical contacts 30, 40 in a manner sufficient to encapsulate the edges of the underlying graphene layer(s) and leave a portion of each of the first and second electrical contacts 30, 40 exposed. The continuous air-resistant coating layer 50 may be provided by e beam evaporation or Atomic Layer Deposition (ALD). In the first embodiment, the continuous air-resistant coating layer 50 may comprise alumina or hafnia or any other suitable encapsulating material.

Preferably, ALD is used to form the continuous air resistant coating 50, since this provides a conformal coating across the entire substrate 10 which provides a more effective air-resistant coating 50. Alumina or hafnia may be patterned by evaporation but the directional nature of such a method risks some edges of the graphene remaining exposed due to shadowing. However, patterning allows regions of the first and second electrical contacts 30, 40 along with regions of the substrate surface 12 to remain uncoated such that dicing of the substrate 10 may be carried out with risk of damaging the coating layer (where a plurality of sensors 1 are formed on the same substrate 10).

The magnetoresistive sensor 1 may be integrated into a circuit using conventional wire bonding or solder bumping to the first and second electrical contacts 30, 40. Where an air-resistant coating layer 50 is formed by ALD, it may then be necessary to puncture the coating to reach each of the first and second electrical contacts for wire bonding which risks causing damage or cracking the air-resistant coating layer 50. In an alternative embodiment, the layer structure 20 is coated with an air-resistant coating layer 50 before deposition of any Ohmic contacts. The coating layer may be selectively etched to expose portions of the graphene edge (lower layer 22 edge) whereupon first and second electrical contacts 30, 40 may be deposited in the etched portions to contact the graphene edge surface.

As shown in FIG. 1, a resistance measurement device 60 may be connected to the first and second electrical contacts 30, 40. As shown in FIG. 1, the resistance measurement device 60 is an Ohmmeter. The resistance measurement device 60 is configured to measure a resistance of the graphene layer(s). When exposed to a magnetic field, the magnetoresistance of the graphene layer(s) will affect the resistance measured by the resistance measurement device 60. The relationship between the resistance of the magnetoresistive sensor 1 and the applied magnetic field may be determined based on a calibration of magnetoresistive sensor 1 (i.e. applying a known magnetic field and measuring the resistance of the magnetoresistive sensor 1). Based on the known relationship, a strength of the magnetic field acting on the magnetoresistive sensor 1 may be calculated based on the measured resistance of the magnetoresistive sensor.

Thus, as described above, a magnetoresistive sensor 1 may be provided in accordance with a first embodiment of the disclosure.

Figure 3A:
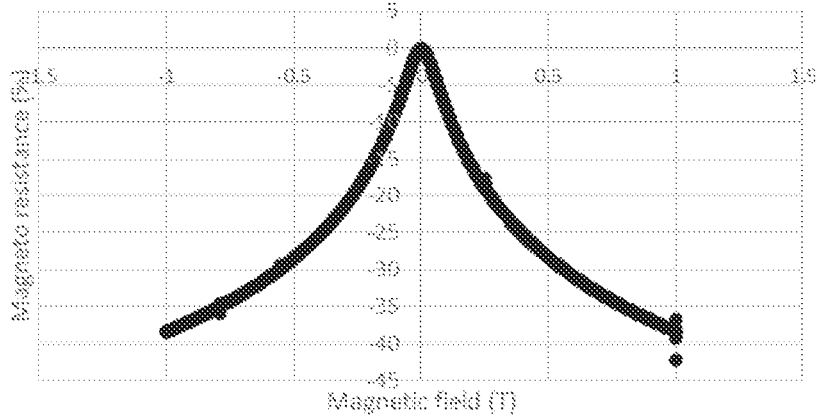
FIGS. 3a, 3b, and 3c show graphs of the magnetoresistance of magnetoresistive sensors under different magnetic fields.

FIG. 3a shows a graph of the magnetoresistance of a magnetoresistive sensor according to an embodiment of the disclosure under magnetic fields ranging from −1 T to +1 T. The magnetoresistive sensor used to produce the graph of FIG. 3a has a structure similar to that shown in the schematic diagram of FIG. 1. The device of FIG. 3a comprises a single graphene layer having a carrier density of about $5\times10^{11}$ cm$^{-2}$. As will be appreciated from FIG. 3a, the magnetoresistance of the device reduces by about 40% as the applied magnetic field magnitude is increased from 0 T to about 1 T. The measurement shown in FIG. 3a was performed at a temperature of 2.5 K (i.e. a cryogenic temperature). As such, it will be appreciated from FIG. 3a that magnetoresistive sensors according to this disclosure may be used to sense magnetic fields at cryogenic temperatures.

It will be appreciated that the magnetoresistance shown in FIG. 3a varies as a percentage of the (magneto)resistance of the device at 0 T. The (magneto)resistance of the device at 0 T will depend on the carrier density of the graphene layer(s) of the magnetoresistive sensor. For example, in the example of FIG. 3a, the magnetoresistance of the device at 0 T at 2.5 K is 83,865Ω.

Figure 3B:
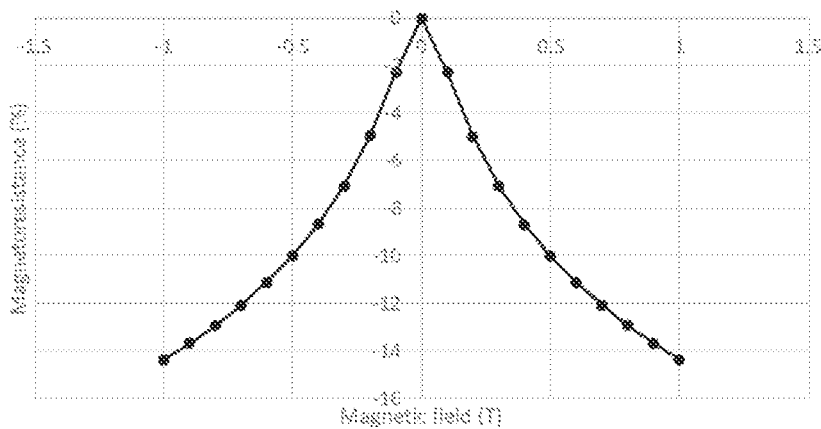
Figure 3C:
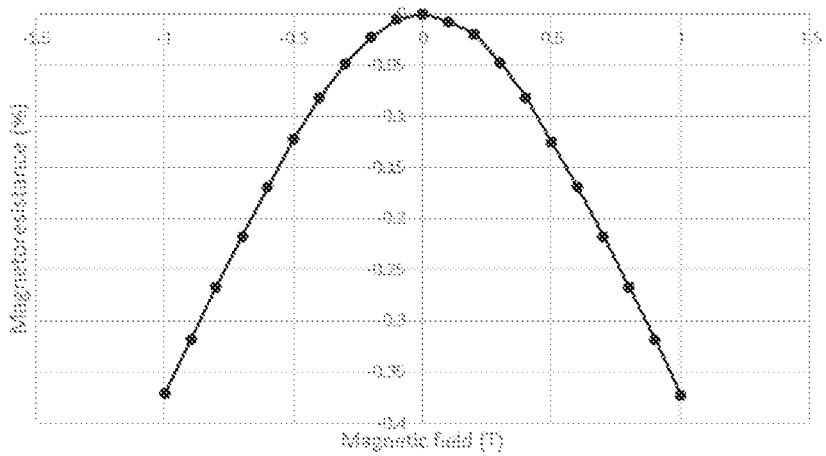

FIGS. 3b, and 3c show graphs of the magnetoresistance of another magnetoresistive sensor according to an embodiment of the disclosure under magnetic fields ranging from −1 T to +1 T. The device of FIGS. 3b and 3c comprises a single graphene layer having a carrier density of about $2.5\times10^{12}$ cm$^{-2}$. As such, the device of FIGS. 3b and 3c has a higher carrier density than the device of FIG. 3a. FIG. 3b shows the magnetoresistive response at 4 K, and FIG. 3c shows the magnetoresistive response at 300 K. As will be appreciated from FIG. 3b, the magnetoresistance of the device reduces by about 14% as the applied magnetic field magnitude is increased from 0 T to about 1 T. As such, it will be appreciated from FIG. 3b that magnetoresistive sensors comprising graphene having a range of different carrier densities according to this disclosure may be used to sense magnetic fields at cryogenic temperatures.

As will be appreciated from FIG. 3c, the magnetoresistance of the device reduces by about 0.37% as the applied magnetic field magnitude is increased from 0 T to about 1 T when operated at 300 K.

In some embodiments, it will be appreciated that the magnetoresistance of the magnetoresistive sensor is temperature dependent. Thus, in embodiments where the temperature of the magnetoresistive sensor may be expected to vary, the magnetoresistive sensor 1 may also be configured to sense a temperature of the magnetoresistive sensor.

As such, in some embodiments, a measurement of the (magneto)resistance of the magnetoresistive sensor 1 may be performed under no applied magnetic field. Based on this resistance measurement, a temperature of the magnetoresistive sensor 1 may be determined. As graphene is a two-dimensional material, it is possible to accurately determine the temperature of the lower layer 22 based on a resistivity measurement of the graphene. The magnetoresistive sensor 1 may use the temperature information to improve the accuracy of the magnetic field determined by the magnetoresistance measurement.

By using a graphene-based temperature sensor, the thermal mass of the temperature sensing part of the magnetoresistive sensor 1 effectively has the same thermal mass as the thermal mass of the graphene used to determine the magnetic field. By using graphene-based devices for both measurements, any variations in temperature of the graphene magnetoresistive sensor will be reflected by variations in the resistance of the graphene. That is to say, unlike temperature sensors formed from a different material to the magnetoresistive sensor, there will be no thermal lag due to differences in thermal mass between the temperature of the magnetoresistive sensor and the measured temperature.

While in some embodiments, the magnetoresistive sensor 1 itself may be used to perform a temperature measurement, in other embodiments, a dedicated graphene-based temperature sensor (not shown) may be provided on the substrate 10 for performing a temperature measurement. Such a temperature sensor may comprise a further graphene sheet and a pair of electrical contacts. The third pair of electrical contacts may be spaced apart on the further graphene sheet. For example, the further graphene sheet may be formed on the substrate 10 in a similar manner to the magnetoresistive sensor 1. As such, the further graphene sheet may be formed directly on the substrate 10 spaced apart from the magnetoresistive sensor 1.

The further graphene sheet may have a substantially rectangular shape, for example similar to the magnetoresistive sensor. In other embodiments, the further graphene sheet may be shaped to provide a resistor of a desired length and/or width in order to provide a desired resistance range between the pair of electrical contacts. As the further graphene sheet is not provided for performing magnetoresistive measurements, there is more design freedom for the shape of the further graphene sheet. Thus, the shape of the further graphene sheet can be used to tailor the resistance of the temperature sensor to improve the accuracy of the resistance measurement. For example, the further graphene sheet may have a generally spiral, or generally S-shape design in order to provide a space-efficient design for a resistor of a desired length. The further graphene sheet may also be tailored to accommodate any packaging requirements for the magnetoresistive sensor 1.

Figure 4:
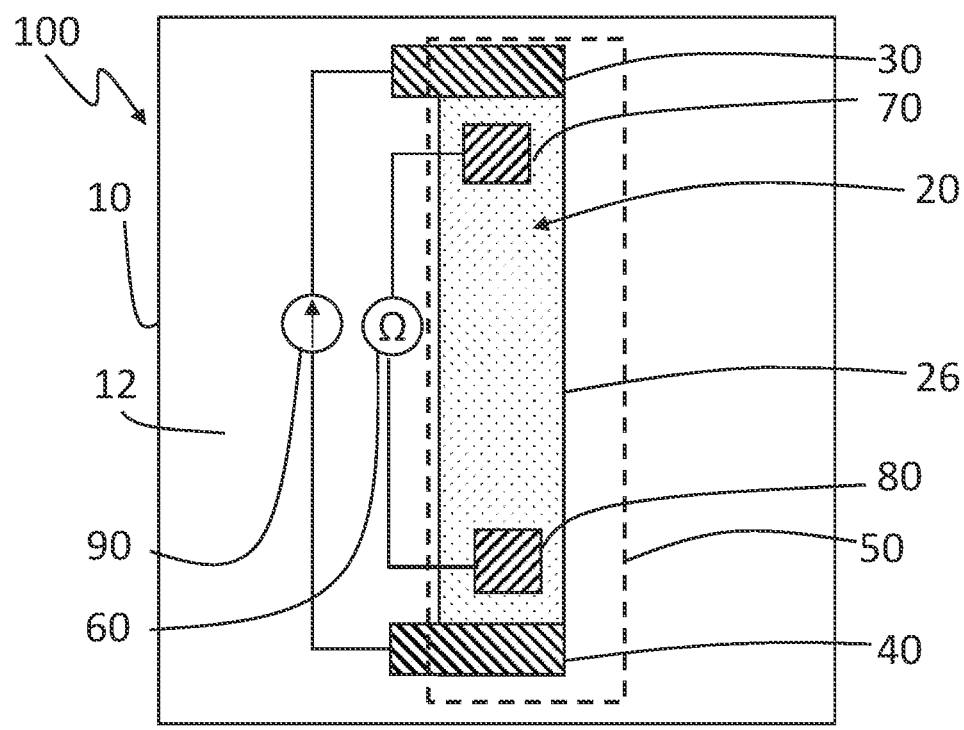
FIG. 4 shows a plan view schematic diagram of a magnetoresistive sensor according to a second embodiment of the disclosure.

The magnetoresistive sensor 1 of the first embodiment is a two-terminal device. According to a second embodiment of the disclosure, a four-terminal magnetoresistive sensor 100 may be provided. A schematic plan view diagram of the second embodiment is shown in FIG. 4. It will be appreciated that the magnetoresistive sensor 100 has many features in common with the magnetoresistive sensor 1 of the first embodiment. The same reference numerals are used in FIG. 4 to indicate similar features.

The magnetoresistive sensor 100 of FIG. 4 comprises a substrate 10, a layer structure 20, a first electrical contact 30, and a second electrical contact 40. These features are substantially the same as the respective features of the first embodiment.

The magnetoresistive sensor 100 also comprises a third electrical contact 70 in direct contact with the graphene layer(s) of the lower layer 22 and a fourth electrical contact 80 in direct contact with the graphene layer(s) of the lower layer 22. As shown in FIG. 4, the third and fourth electrical contacts 70, 80 are each provided on the on the graphene layer(s). As such, the third and fourth electrical contacts may form part of the lower layer 22. The upper layer 24 may be provided over the third and fourth contacts 70, 80, regions of the upper layer 24 may be subsequently selectively removed to make contact to the third and fourth electrical contacts. Alternatively, the upper layer 24 may be formed on the lower layer 22 wherein apertures may be formed within the upper layer 24 to allow for the third and fourth contacts 70, 80 to be formed within the apertures.

The third and fourth electrical contacts 70, 80 are each configured to form an Ohmic contact to the graphene layer(s). According to the second embodiment, the third and fourth electrical contacts 70, 80 may be formed from a similar material to the first and second electrical contacts 30, 40.

The four terminal device of the second embodiment is configured to have a voltage source 90 applied between the first and second electrical contacts 30, 40. While a constant voltage is applied, a resistance measurement device 60 may be connected between the third and fourth electrical contacts 70, 80 to measure the resistance of the graphene layer(s). Such four-terminal resistance techniques are known in the art. By measuring the magnetoresistance of the graphene layer(s) using a four terminal method, the contact resistance of the electrical contacts may be eliminated from the measurement, thereby improving the accuracy of the measurement.

The second embodiment 100 provides a four-terminal device where the third and fourth electrical contacts are provided on the graphene layer(s). According to a third embodiment of the disclosure, a magnetoresistive sensor 200 is provided, wherein a four terminal device utilises edge connections to the graphene layer(s) for the third and fourth electrical contacts 70, 80.

Figure 5:
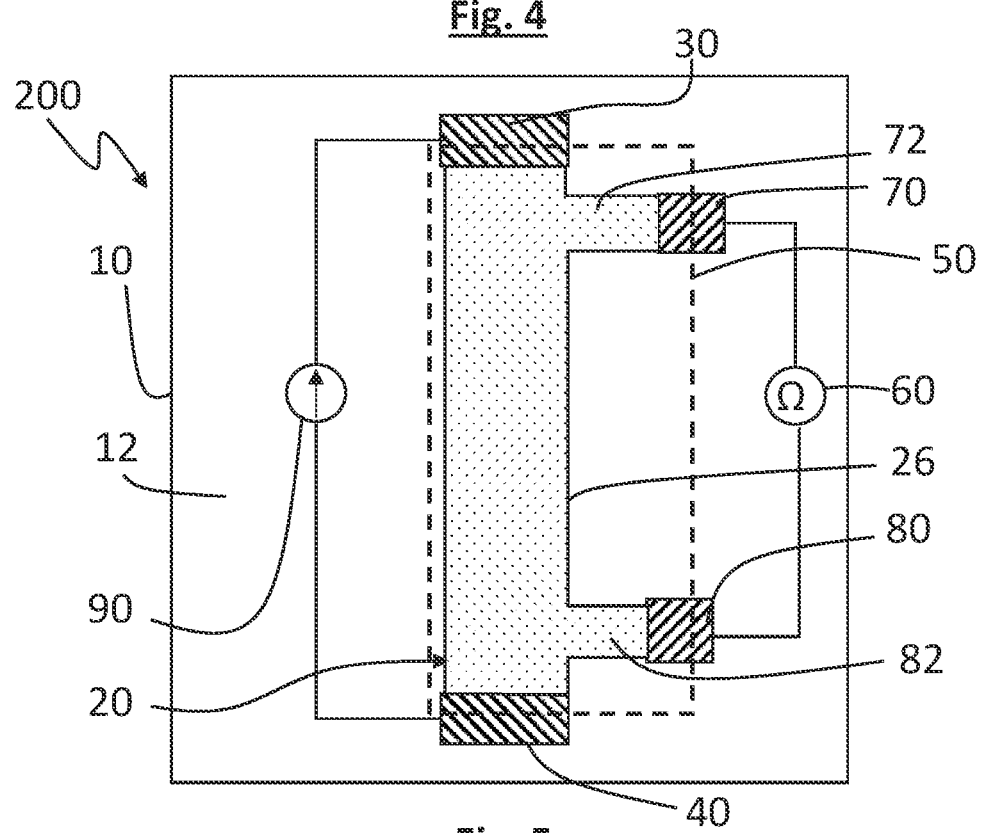
FIG. 5 shows a plan view schematic diagram of a magnetoresistive sensor according to a third embodiment of the disclosure.

FIG. 5 shows a schematic diagram of the magnetoresistive sensor 200 according to the third embodiment. The magnetoresistive sensor 200 of FIG. 5 comprises a substrate 10, a layer structure 20, a first electrical contact 30, and a second electrical contact 40. These features may be substantially the same as the respective features of the first embodiment.

As shown in FIG. 5, the third electrical contact 70 is provided on a fourth region of the substrate 10 adjacent to the layer structure 20 such that the third electrical contact 70 is in direct contact with the graphene layer(s) via the continuous outer edge surface 26 of the layer structure 20. The fourth electrical contact 80 is provided on a fifth region of the substrate 10 adjacent to the layer structure 20 such that the fourth electrical contact is in direct contact with the graphene layer(s) via the continuous outer edge surface 26 of the layer structure 20. As such, the third and fourth electrical contacts 70, 80 may in electrical contact with the graphene layer(s) in a similar manner to the first and second electrical contacts 30, 40. As shown in FIG. 5, the third and fourth electrical contacts 70, 80 are spaced apart along the length of the graphene layer(s) between the first and second electrical contacts for the purpose of performing a four terminal resistance measurement.

As shown in FIG. 5, the layer structure 20 is generally rectangular shaped (in plan view). The layer structure 20 of FIG. 5 includes contact protrusions 72, 82 from the rectangular shape for each of the third and fourth electrical contacts 70, 80. It will be appreciated that such protrusions 72, 82 are optional, and that the third and fourth electrical contacts 70, 80 could be provided spaced apart along a continuous outer edge surface of e.g. a rectangular shaped layer structure 20.

Accordingly, the third embodiment of the disclosure provides a four terminal magnetoresistive sensor 200, wherein each of the four terminals is in direct electrical contact with the graphene layer(s) via a continuous edge surface of the layer structure 20.

The first, second, and third embodiments 10, 100, 200 of the disclosure relate to layer structures 20 having a generally rectangular shape. Each of the layer structures 20 has a single continuous edge surface which is an outer edge surface 26 of the respective layer structure 20. According to a fourth embodiment of the disclosure, a magnetoresistive sensor 300 is provided, wherein the layer structure 20 comprises a plurality of continuous edge surfaces.

Figure 6:
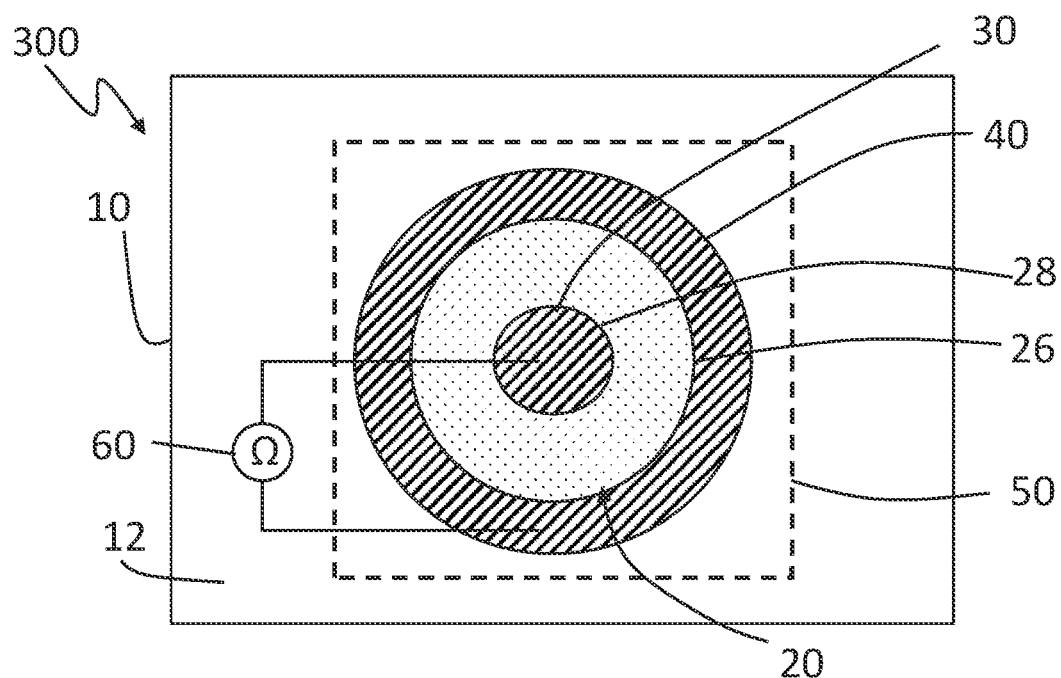
FIG. 6 shows a plan view schematic diagram of a magnetoresistive sensor according to a fourth embodiment of the disclosure.

FIG. 6 shows a schematic plan view diagram of the fourth embodiment 300. As shown in FIG. 6, the layer structure 20 has a generally annular shape (in plan view). As such, the layer structure 20 comprises a continuous outer edge surface 26 and a continuous inner edge surface 28. In the embodiment of FIG. 6, the first and second electrical contacts 30, 40 are provided on different edge surfaces of the plurality of continuous edge surfaces 26, 28. The first electrical contact 30 is provided in direct contact with the inner edge surface 26. The second electrical contact 40 is provided in direct contact with the outer edge surface 28. As shown in FIG. 6 the first and second electrical contacts 30, 40 are provided in direct contact with the entire length of the respective continuous edge surface 26, 28. As such, the resistance measurement is performed in the radial direction of the device. Such a device configuration is sometimes referred to as a "Corbino disc" configuration. This geometry eliminates any Hall voltage contribution and allows achieving the maximal values of longitudinal magnetoresistance (caused by Gauss effect) in the graphene layer(s).

While the embodiment 300 of FIG. 6 shows a two terminal device, it will be appreciated that a four terminal device could also be provided using a Corbino disc configuration. For example, third and fourth electrical contacts 30, 40 may be provided on the graphene layers. The third and fourth electrical contacts may, for example, have an annular shape similar to the second electrical contact 40 shown in FIG. 6.

Thus, a magnetoresistive sensor 300 may be provided in accordance with a fourth embodiment of the disclosure.

The first through fourth embodiments of the disclosure provide a magnetoresistive sensor 1, 100, 200, 300, having a layer structure 20. According to a fifth embodiment, a magnetoresistive sensor 400 may be provided in which the layer structure 20 comprises an upper layer 22 having a different shape to the shape of the lower layer 22.

Figure 7:
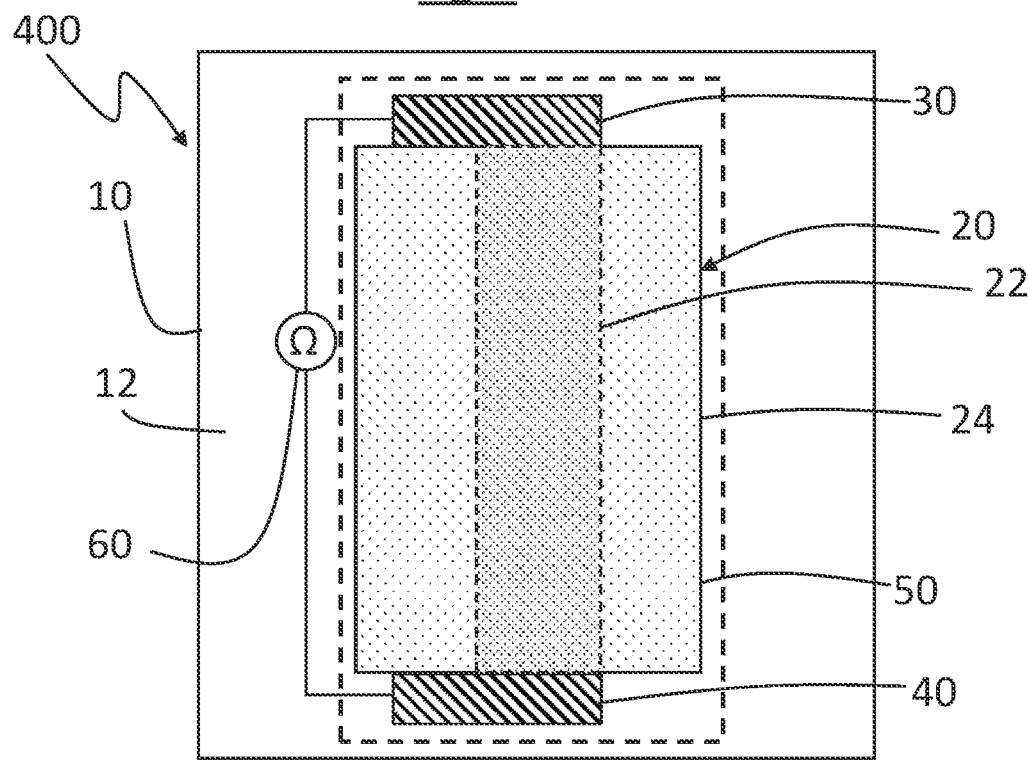
FIG. 7 shows a plan view schematic diagram of a magnetoresistive sensor according to a fifth embodiment of the disclosure.

FIG. 7 shows a diagram of a magnetoresistive sensor of the fifth embodiment 400. The magnetoresistive sensor 400 may have a structure which is generally similar to the first embodiment 1 in that it comprises a substrate 10 having a layer structure 20 thereon. Similar to the first embodiment 1, the layer structure 20 comprises a lower layer 22 provided on the substrate 10, wherein the lower layer 22 comprises one or more graphene layers which extend across the lower layer 22. The layer structure 20 also comprises an upper layer 24 on the lower layer 22 and formed of a dielectric material. As discussed above, the upper layer 24 may be formed from a plurality of sub-layers, for example first and second sub-layers.

Similar to the first embodiment, a first electrical contact 30 is provided adjacent to the layer structure such that the first electrical contact is in direct contact with the one or more graphene layers. A second electrical contact 40 is also provided adjacent to the layer structure 20 such that the second electrical contact 40 is in direct contact with the one or more graphene layers.

The layer structure 20 of the fifth embodiment 400 comprises an upper layer 24 of a different shape to the lower layer 22. In the embodiment of FIG. 7, the upper and lower layers 22, 24 share continuous edge surfaces where the lower layer 22 is provided in direct contact with the first and second electrical contacts 30, 40. As shown in FIG. 7, the upper layer 24 may extend beyond the lower layer 22. As such, the upper layer 24 may be provided over a greater surface area than the lower layer 22. In some embodiments, the lower layer 22 and the upper layer 24 may each be processed and etched individually in order to provide the lower and upper layers 22, 24 with different shapes. For example, a lithographic technique may be used to define the shape of each of the layers 22, 24, followed by etching. Alternatively, a shadow mask may be used to define the shape of, for example the upper layer 24. Where the upper and lower layers 22, 24 share a continuous edge surface, an etching method may be used to etch both layers 22, 24 along the continuous edge surface.

The magnetoresistive sensor 400 of the fifth embodiment also comprises a continuous air-resistant coating layer covering the layer structure 20.

While the first and second electrical contacts 30, 40 of the fifth embodiment 400 are provided adjacent to the lower layer 22, in some embodiments the first and second electrical contacts may be provided not adjacent to the lower layer 22. For example, in some embodiments, first and second electrical contacts 30, 40 may be provided directly on the lower layer 22 in a similar manner to the third and fourth electrical contacts 70, 80 shown in FIG. 4. As such, in some embodiments, a magnetoresistive sensor may be provided with first and second electrical contacts which are formed directly on the lower layer 22. The upper layer 24 may be provided over the first and second electrical contacts or apertures may be provided within the upper layer 24 for the first and second electrical contacts.

Next, a method of producing a magnetoresistive sensor 1, 100, 200, 300, 400 will be described. The following method may be used to form any of the above described embodiments of the disclosure. For ease of explanation, the following method will refer to a method of forming a magnetoresistive sensor 1 according to the first embodiment.

The method comprises a first step of providing a plasma-etchable layer structure on a first region of a plasma-resistant substrate 10. The plasma-etchable layer structure has an exposed upper surface. The plasma-etchable layer structure comprises one or more graphene layers extending across the plasma layer structure. As such, the plasma-etchable layer structure is a precursor to the lower layer 22 of the layer structure 20. The plasma-etchable may be formed across substantially all of the major surface 12 of the substrate 10.

The graphene layers may be formed according to the process described in at least WO-A-2017/029470, although other methods of forming one or more layers of graphene on a substrate 10 may also be used.

In a second step, a plasma-resistant dielectric is patterned onto a portion of the exposed upper surface to form an intermediate having at least one covered region and at least one uncovered region of the plasma-etchable layer structure. The plasma-resistant dielectric forms the upper layer 24 of the layer structure 20. The plasma-etchable layer structure may be formed by e-beam evaporation of alumina through a shadow mask. Alternatively, a lithographic method may be used to pattern the plasma-resistant dielectric. Alternatively, the plasma-resistant dielectric may be formed by an ALD process as discussed above. In some embodiments, the plasma-resistant dielectric may comprise a plurality of sub-layers for example, first and second sub-layers as discussed above.

In a third step, the intermediate is subjected to plasma etching. Plasma etching results in the at least one uncovered region of the plasma-etchable layer structure being etched away. The resulting structure comprises the upper layer 24 of the layer structure, with the lower layer 22 (i.e. the graphene layer(s)) beneath. As such, a plasma-etching process is used to form layer structure layer 20 having one or more continuous edge surfaces. For the embodiment of FIG. 1, the layer structure 20 formed has a continuous outer edge surface 26.

In a fourth step, a first electrical contact 30 is formed on a second region of the substrate 10 adjacent to the layer structure such 20 that the first electrical contact 30 is in direct contact with the one or more graphene layers via the continuous outer edge surface 26. A second electrical contact 40 is formed on a third region of the substrate 10 adjacent to the layer structure 20. The second electrical contact 40 is in direct contact with the one or more graphene layers via the continuous outer edge surface 26. The first and second electrical contacts 30, 40 may be formed simultaneously using a thermal evaporation process. The first and second electrical contacts 30, 40 may be patterned into a desired shape using a lithographic process or a shadow mask.

In a fifth step a continuous air-resistant coating layer 50 is formed over the layer structure 20 and at least a portion of the first and second electrical contacts 30, 40. The air-resistant coating layer is provided to encapsulate the graphene layer(s) from air or other environmental contaminants. The air-resistant coating layer 50 may comprise a dielectric material such as alumina or hafnia.

Thus, a magnetoresistive sensor 1, 100, 200, 300, 400 may be formed in accordance with the above method.

Although preferred embodiments of the invention have been described in detail herein, it will be understood by those skilled in the art that variations to these embodiments may be made without departing from the scope of the invention or the appended claims.

The invention claimed is:

1. A magnetoresistive sensor comprising:
   a substrate having a layer structure thereon, the layer structure comprising:
   a lower layer provided on the substrate, wherein the lower layer comprises one or more graphene layers which extend across the lower layer; and
   an upper layer on the lower layer and formed of a dielectric material;
   wherein the lower and upper layers of the layer structure share one or more continuous edge surfaces;

a first electrical contact provided adjacent to the layer structure such that the first electrical contact is in direct contact with the one or more graphene layers via one of the one or more continuous edge surfaces;

a second electrical contact provided adjacent to the layer structure such that the second electrical contact is in direct contact with the one or more graphene layers via one of the one or more continuous edge surfaces; and a continuous air-resistant coating layer covering the layer structure; wherein the magnetoresistive sensor is configured to sense a magnetic field.

2. The magnetoresistive sensor according to claim 1, wherein when viewed in a plan view, one of the one or more continuous edge surfaces of the layer structure is a continuous outer edge surface of the layer structure.

3. The magnetoresistive sensor according to claim 1, wherein the layer structure is provided on a first region of the substrate, the first electrical contact is provided on a second region of the substrate, and the second electrical contact is provided on a third region of the substrate.

4. The magnetoresistive sensor according to claim 3, wherein the second region of the substrate on which the first electrical contact is provided and the third region of the substrate on which the third electrical contact is provided are located at opposite ends of the first region of the substrate on which the layer structure is provided.

5. The magnetoresistive sensor according to claim 1, wherein the layer structure is shaped such that one of the one or more continuous edge surfaces of the layer structure defines a rectangular shape on the substrate when viewed in plan view.

6. The magnetoresistive sensor according to claim 1, wherein the layer structure is annular-shaped when viewed in plan view, such that the one or more continuous edge surfaces comprise a continuous outer edge surface and a continuous inner edge surface.

7. The magnetoresistive sensor according to claim 5, wherein the layer structure is provided on a first region of the substrate;

the first electrical contact is provided on a second region of the substrate; and the second electrical contact is provided on a third region of the substrate;

wherein the first electrical contact is provided on the second region of the substrate adjacent to the layer structure such that the first electrical contact is in direct contact with the one or more graphene layers via the continuous outer edge surface; and/or wherein the second electrical contact is provided on the third region of the substrate adjacent to the layer structure such that the third electrical contact is in direct contact with the one or more graphene layers via the continuous inner edge surface.

8. The magnetoresistive sensor according to claim 1, further comprising:

a third electrical contact in direct contact with the one or more graphene layers; and a fourth electrical contact in direct contact with the one or more graphene layers, the fourth electrical contact spaced apart from the third electrical contact, wherein the first and second electrical contacts are configured to receive a bias current, and the third and fourth electrical contact are configured to sense a magneto resistance of the one or more graphene layers.

9. The magnetoresistive sensor according to claim 8, wherein the third and fourth electrical contacts are each provided on the one or more graphene layers between the lower layer and the upper layer of the layer structure.

10. The magnetoresistive sensor according to claim 8, wherein when viewed in a plan view, one of the one or more continuous edge surfaces of the layer structure is a continuous outer edge surface of the layer structure;

the third electrical contact is provided on a fourth region of the substrate adjacent to the layer structure such that the third electrical contact is in direct contact with the one or more graphene layers via the continuous outer edge surface; and the fourth electrical contact is provided on a fifth region of the substrate adjacent to the layer structure such that the fourth electrical contact is in direct contact with the one or more graphene layers via the continuous outer edge surface.

11. The magnetoresistive sensor according to claim 1, wherein the substrate comprises sapphire, silicon, silicon dioxide, silicon nitride, silicon carbide, germanium, or a Group III-V semiconductor.

12. The magnetoresistive sensor according to claim 11, wherein the substrate comprises a growth surface formed of a material selected from the group consisting of yttrium stabilised zirconium oxide (YSZ), magnesium aluminate (MgAl2O4), yttrium aluminium perovskite (YAlO3 or YAP), strontium titanate (SrTiO3), and calcium difluoride (CaF2).

13. The magnetoresistive sensor according to claim 1, wherein the dielectric material comprises an inorganic oxide, nitride, carbide, fluoride or sulphide.

14. The magnetoresistive sensor according to claim 1, wherein the continuous air-resistant coating layer comprises an inorganic oxide, nitride, carbide, fluoride or sulphide.

15. The magnetoresistive sensor according to claim 1, wherein the continuous air-resistant coating layer also at least partially covers one or more of: the first electrical contact, the second electrical contact, and the substrate.

16. The magnetoresistive sensor according to claim 1 provided as part of a magnetoresistive measurement system, wherein the magnetoresistive measurement system comprises a resistance measurement system connected to the magnetoresistive sensor, the resistance measurement system configured to measure a resistance of the one or more graphene layers.

17. A method of sensing a magnetic field comprising:

exposing a magnetoresistive sensor according to claim 1 to a magnetic field;

measuring a resistance of the magnetoresistive sensor under the magnetic field; and calculating a strength of the magnetic field based on the resistance of the magnetoresistive sensor under the magnetic field.

18. The method according to claim 17, further comprising:

measuring a resistance of the magnetoresistive sensor under no applied magnetic field; and determining a temperature of the magnetoresistive sensor based on the resistance of the magnetoresistive sensor under no applied magnetic field, wherein the strength of magnetic field is calculated based on resistance of the magnetoresistive sensor under the magnetic field and the determined temperature of the magnetoresistive sensor.

19. A method of producing a magnetoresistive sensor, the method comprising:
(i) providing a plasma-etchable layer structure on a substrate, wherein the plasma-etchable layer structure has an exposed upper surface, the plasma-etchable layer structure comprising one or more graphene layers extending across the plasma layer structure;
(ii) patterning a plasma-resistant dielectric onto a portion of the exposed upper surface to form an intermediate having at least one covered region and at least one uncovered region of the plasma-etchable layer structure;
(iii) subjecting the intermediate to plasma etching, whereby the at least one uncovered region of the plasma-etchable layer structure is etched away to form at least one etched layer structure layer structure having one or more exposed edge surfaces;
(iv) forming a first electrical contact adjacent to the etched layer structure such that the first electrical contact is in direct contact with the one or more graphene layers via one of the one or more edge surfaces and a second electrical contact adjacent to the etched layer structure such that the second electrical contact is in direct contact with the one or more graphene layers via one of the one or more edge surfaces;
(v) forming a continuous air-resistant coating layer over the etched layer structure; wherein the magnetoresistive sensor is configured to sense a magnetic field.

20. The magneto resistive sensor according to claim 1, wherein
the dielectric layer comprises alumina or silica; and/or
the continuous air-resistant coating layer comprises alumina or silica.

* * * * *